(12) United States Patent
Watanabe et al.

(10) Patent No.: US 6,865,088 B2
(45) Date of Patent: Mar. 8, 2005

(54) ELECTRONIC EQUIPMENT WITH STAY FOR REINFORCING CIRCUIT BOARD WITHIN CASING

(75) Inventors: Tsutomu Watanabe, Hamamatsu (JP); Takashi Fujita, Hamamatsu (JP)

(73) Assignee: Yamaha Corporation, Hamamatsu (JP)

(*) Notice: Subject to any disclaimer, the term of this patent is extended or adjusted under 35 U.S.C. 154(b) by 0 days.

(21) Appl. No.: 10/677,059

(22) Filed: Sep. 30, 2003

(65) Prior Publication Data
US 2004/0066641 A1 Apr. 8, 2004

(30) Foreign Application Priority Data
Oct. 4, 2002 (JP) .......................... 2002-292364

(51) Int. Cl.[7] .......................... H05K 5/00; H05K 5/04; H05K 5/06
(52) U.S. Cl. .................. 361/758; 361/740; 361/742; 361/747; 361/752
(58) Field of Search ................ 361/728, 736, 361/737, 740–742, 746–748, 752, 756, 758–759, 801–802, 804, 807, 809–810, 825; 211/41.17, 26.2; 312/223.1

(56) References Cited

U.S. PATENT DOCUMENTS

| | | | | |
|---|---|---|---|---|
| 5,508,889 A | * | 4/1996 | Ii | 361/816 |
| 6,031,732 A | * | 2/2000 | Koike et al. | 361/816 |
| 6,122,178 A | * | 9/2000 | Andrews et al. | 361/800 |

* cited by examiner

Primary Examiner—Phuong T. Vu
(74) Attorney, Agent, or Firm—Morrison & Foerster LLP

(57) ABSTRACT

An electronic equipment contains a circuit board in a casing. The casing encloses a spacing and has a top panel covering the spacing. The circuit board has a pair of end portions and a major surface extending between the pair of the end portions for mounting electronic parts on the major surface. The circuit board is disposed in the spacing of the casing in opposed relation to the top panel. A stay member has an elongated shape extending between the pair of the end portions of the circuit board for reinforcing the major surface of the circuit board. The stay member has a bottom coupling portion disposed in contact with the major surface of the circuit board for coupling with the circuit board, and a top contact portion disposed in contact with a back surface of the top panel for engagement with the casing.

13 Claims, 6 Drawing Sheets

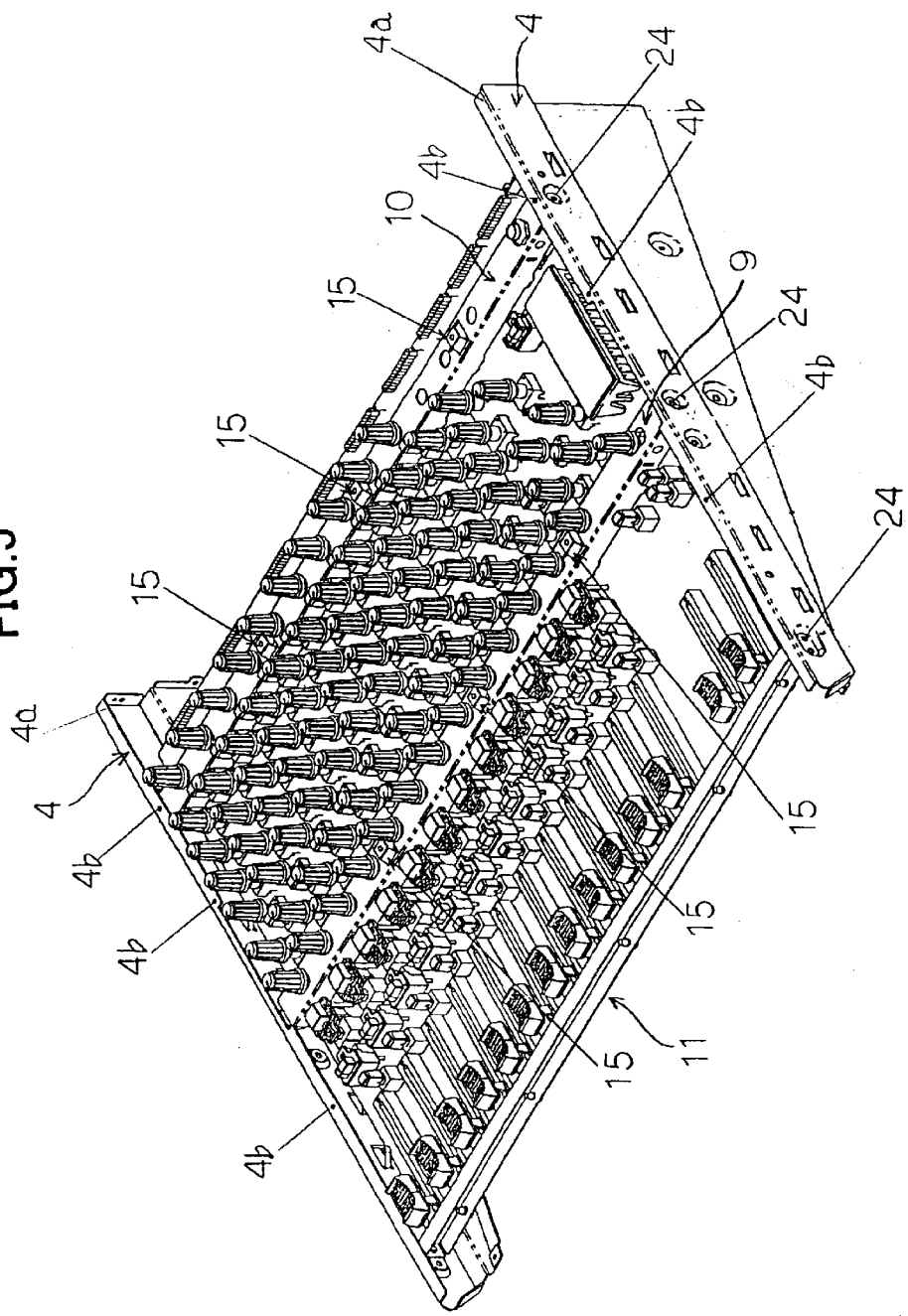

ELECTRONIC EQUIPMENT WITH STAY FOR REINFORCING CIRCUIT BOARD WITHIN CASING

BACKGROUND OF THE INVENTION

1. Technical Field of the Invention

The present invention relates to a mounting structure between a panel constituting a casing and a circuit board, and an electronic equipment having the structure.

2. Prior Art

As a structure of mounting a circuit board within a casing of an electronic equipment, for example in the case of an acoustic mixing machine, a circuit board in which a lot of electronic parts such as a volume element, a push button switch, a fader unit and the like are mounted is covered with a button base, and the circuit board and the button base are fixed to a top panel constituting the casing by using a lot of screws. A lot of holes through which manual operating electronic parts such as the volume element and the like mounted on the circuit board are inserted are formed in the button base. The button base is a tray-shaped resin molded article which functions as a guide for the manual operating electronic part and functions as a spacer between the circuit board and the top panel.

However, in the case that the electronic circuit assembly is mounted to the panel in the manner mentioned above, the following problems are generated.

In general, the electronic circuit assembly is structured by mounting the electronic parts on a printed circuit board formed by a glass epoxy or the like and soldering by means of a solder dip by using a flow soldering apparatus or the like, however, in the case of a large-size circuit board, a warpage tends to be generated on the circuit board. In a state in which the warpage is generated on the circuit board, a workability is deteriorated in the case of screw fastening to the top panel of the casing, and further, there is a case that an undesirable influence is exerted on the solder or the parts at a time of correcting the warpage right by screw fastening.

Further, in order to remove the warpage of the circuit board, it is necessary to arrange a lot of tubular bosses serving as a spacer on a back surface of the top panel, and screw fasten through a threaded hole formed in the circuit board. Further, in the case that the electronic parts mounted on the circuit board include a plurality of operating parts such as the volume element and the like, it is necessary to arrange a lot of tubular bosses so as to support the circuit board, for the purpose of preventing the circuit board from being deformed by a pressing force at a time of operating. Accordingly, a lot of time is required for the screw fastening work.

SUMMARY OF THE INVENTION

Accordingly, an object of the present invention is to provide an electronic equipment having a mounting structure for a circuit board which can clear the conventional problems mentioned above, can prevent the circuit board from being warped and can reduce a time for mounting work.

The object mentioned above of the present invention can be achieved by an electronic equipment comprising a casing that encloses a spacing and that has a top panel covering the spacing, a circuit board that has a pair of end portions and a major surface extending between the pair of the end portions for mounting electronic parts on the major surface, the circuit board being disposed in the spacing of the casing in opposed relation to the top panel, and a stay member that has an elongated shape extending between the pair of the end portions of the circuit board for reinforcing the major surface of the circuit board, the stay member having a bottom coupling portion disposed in contact with the major surface of the circuit board for coupling with the circuit board, and a top contact portion disposed in contact with a back surface of the top panel for engagement with the casing.

Since the circuit board is set to a state where the circuit board is connected to the stay member, by employing the structure mentioned above, it is possible to prevent the circuit board from being warped at a time of applying a solder dip. Further, without independently using a lot of spacer parts such as the bosses, the top contact portion can function as a spacer by being brought into contact with the top panel.

Preferably, the casing has a pair of side panels disposed along opposite ends of the top panel for accommodating the circuit board between the pair of the side panels, and the stay member has a pair of end coupling portions at opposite ends of the elongated shape for coupling with the side panels. The side panel has a top panel mounting piece formed by bending an edge of the side panel, and the top panel mounting piece is formed with a threaded hole, while the top panel has an opening in correspondence with the threaded hole of the top panel mounting piece of the side panel, such that the side panel is fixed to the top panel by engaging a screw inserted into the opening of the top panel with the threaded hole. Namely, the stay member is connected to the top panel and side panels of the casing by means of screws or the like. In accordance with this structure, it is possible to finish the top panel having no surface torsion and a high flatness. In other words, since a channel structure having an H-shaped cross section or an I-shaped cross section is formed by connecting the circuit board to which the stay member is connected, the top panel and the side panel with each other. Utilizing a height of the stay member, a magnitude of a geometrical moment of inertia becomes great in a direction of cutting the stay member vertically, and a rigidity of the assembly is increased.

In order to position the stay member on the circuit board, it is preferable that the stay member is provided with a guide protrusion fitted to a guide hole formed on the circuit board, and the stay member is positioned on the circuit board by fitting the guide protrusion to the guide hole. The bottom coupling portion of the stay member includes a plurality of guide protrusions, at least one of which has a hook at the end of the guide protrusion, the hook being inserted into the guide hole of the circuit board and being bent so as to fix the stay member to the circuit board. The guide protrusion has a step portion at a root portion of the guide protrusion, the step being brought into contact with the major surface of the circuit board when the guide protrusion is engaged with the guide hole.

Preferably, the stay member has an elongated top plate extending between the pair of the end portions of the circuit board in opposed relation to the top panel, and a pair of elongated parallel plates folded downward from the elongated top plate such that the elongated top plate and the pair of the elongated parallel plates define a groove having a rectangular cross section for accommodating therein an electronic part. For example, the stay member is formed in an approximately C-shaped cross section, and some of the electronic parts are received in a groove surrounded by three walls of the stay member having the approximately C-shaped cross sectional shape.

In accordance with this structure, it is possible to effectively utilize an area of the circuit board without narrowing an electronic parts mounting area on the circuit board. Further, since the stay member is provided with a width and a height which can receive some of the electronic parts, a geometrical moment of inertia of the stay member is increased, so that the casing to which the stay member mentioned above is connected has no surface torsion and has an increased rigidity.

Further, the elongated top plate of the stay member has an opening for allowing the electronic parts accommodated in the groove to penetrate through the opening into the top panel of the casing. The opening allows the electronic parts such as the volume element, the switch and the like exposing above the top panel, whereby the electronic parts mounting area on the circuit board is not limited.

Further, it is preferable that a plurality of raised portions are formed along the stay member in spaced relation. Each of the raised portions functions as the top contact portion, and some of the raised portions selected from the plurality of the raised portions are connected to the top panel. In accordance with this structure, it is possible to shorten the screw fastening work. The raised portions are provided with a spacer function between the circuit board and the top panel. Further, since the deformation of the circuit board is inhibited by the stay member, the work of correcting the warpage of the circuit board by fastening a lot of screws is not required.

Preferably, the elongated parallel plate of the stay member is formed with a convex portion penetrating into the groove of the stay member so as to restrict an unnecessary rotation of the electronic part accommodated in the groove of the stay member.

Preferably, the electronic equipment further comprises a plurality of stay members arranged in parallel to each other and coupled to the major surface of the circuit board for reinforcing the circuit board, one of the stay members having a different shape than other stay members such that said one stay member has an elongated top plate placed in opposed relation to the top panel, an elongated bottom plate placed in contact with the circuit board, and an elongated side plate connecting between the elongated top plate and the elongated bottom plate, the elongated top plate and the elongated bottom plate has a width smaller that a height of the elongated side wall.

BRIEF DESCRIPTION OF THE DRAWINGS

FIGS. 4(a), 4(b) and 4(c) show one of the stay members shown in FIG. 2, in which FIG. 4(a) is a perspective view, FIG. 4(b) is a partly enlarged side elevational view and FIG. 4(c) is a cross sectional view along a line A—A in FIG. 4(a).

FIG. 5 is a perspective view showing a state in which the circuit board in FIG. 2 is mounted to side panels of the casing.

DETAILED DESCRIPTION OF THE INVENTION

A description will be given below of a preferable embodiment in accordance with the present invention on the basis of an acoustic mixing machine corresponding to one example of an electronic equipment in accordance with the present invention, with reference to FIGS. 1 to 6.

Figure 1:
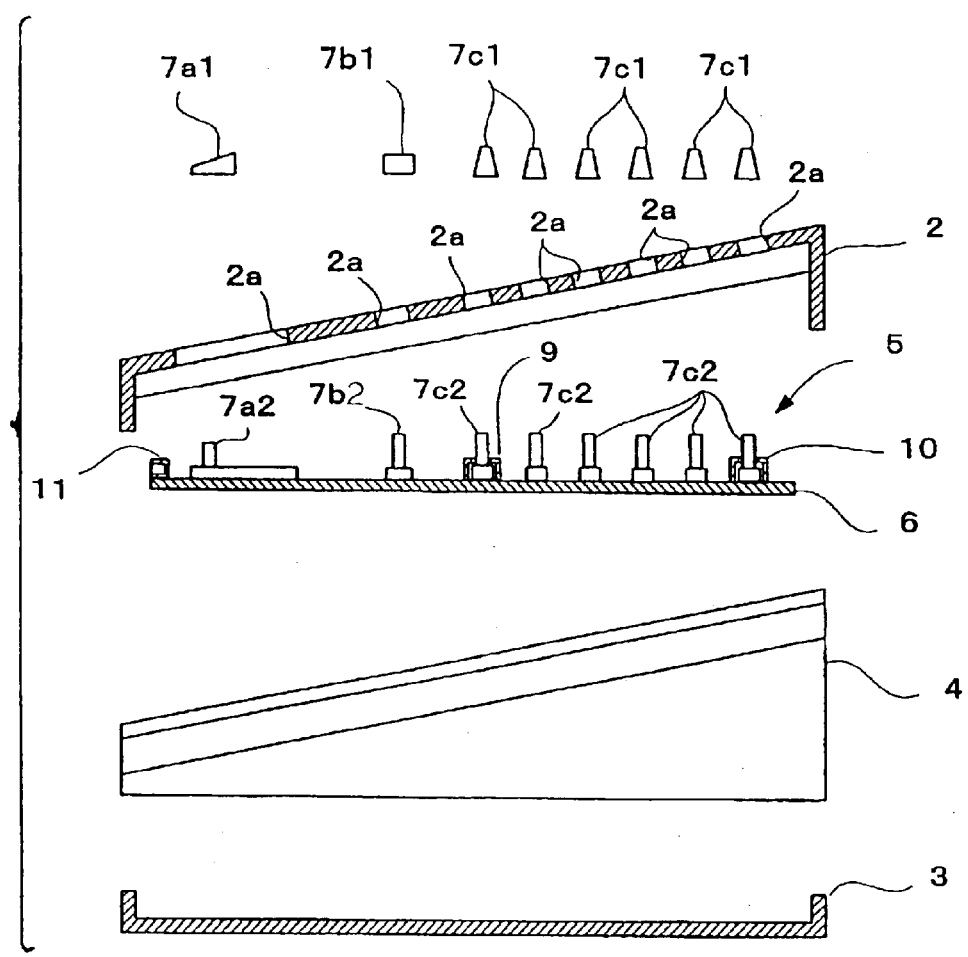
FIG. 1 is a vertical cross sectional side elevational view schematically showing a state before fixing a circuit board to a casing.
Figure 6:
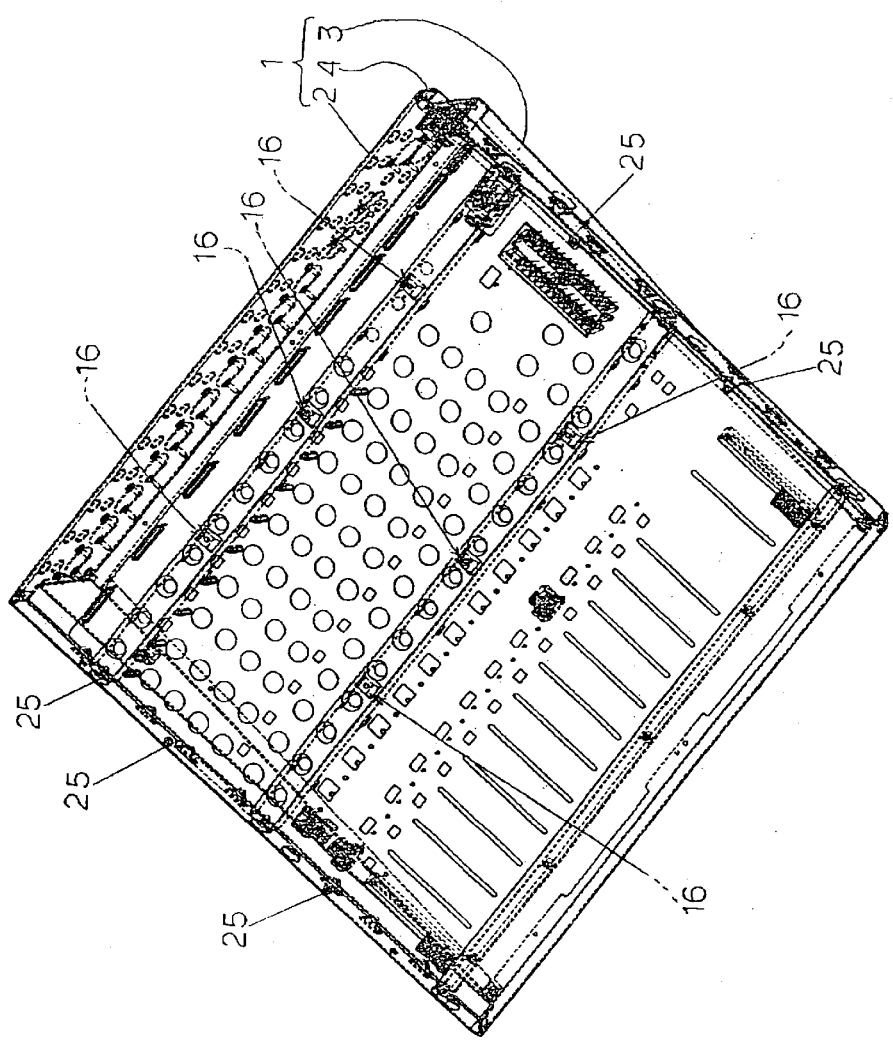
FIG. 6 is a perspective view showing an outer appearance of an electronic equipment to which the circuit board in FIG. 2 is mounted, where the electronic parts are omitted from illustration and an inner portion is shown by a dotted line.

A casing 1 of an acoustic mixing machine has a top panel 2, a bottom panel 3 and side panels 4 (refer to FIG. 5), as shown in FIGS. 1, 5 and 6, and each of the elements is formed by a sheet metal.

Electronic parts 7 such as faders 7a, push button switches 7b with a luminescent function, volume elements (variable resistors) 7c, ICs 7d and the like are mounted on a circuit board 6 by inserting terminals 8 (refer to FIG. 3) of the electronic parts 7 to through-holes (not shown) and soldering, whereby an electronic circuit assembly 5 is formed, which has a performance and capability specific to the electronic equipment.

On the top panel 2 of the casing 1, there are formed insertion holes 2a for inserting shaft portions 7a2, 7b2 and 7c2 to which manual operating elements 7a1, 7b1 and 7c1 of the electronic parts 7 are attached, as shown in FIG. 1.

In the electronic circuit assembly 5, in addition to the electronic parts 7, totally three stay members 9, 10 and 11 extending toward opposite end portions of the circuit board 6 are connected to an approximately center portion and both side portions of the circuit board 6.

The stay members 9 and 10 are formed in an elongated shape having a length substantially matching to a length of the circuit board 6, and in the illustrated embodiment, are formed in an approximately C-shaped cross sectional shape or an approximately channel-like cross sectional shape comprising an elongated top plate 12 and a pair of elongated parallel plates 13 perpendicularly connected to the elongated top plate 12. However, the stay members 9 and 10 may employ various shapes such as an approximately I-shaped cross sectional shape, an approximately H-shaped cross sectional shape and the like, and preferably have an angle portion (a corner portion) in order to improve a bending rigidity. The stay members 9, 10 and 11 are formed in accordance with a sheet metal work including a press work and a bending work after punching work.

Figure 4A:
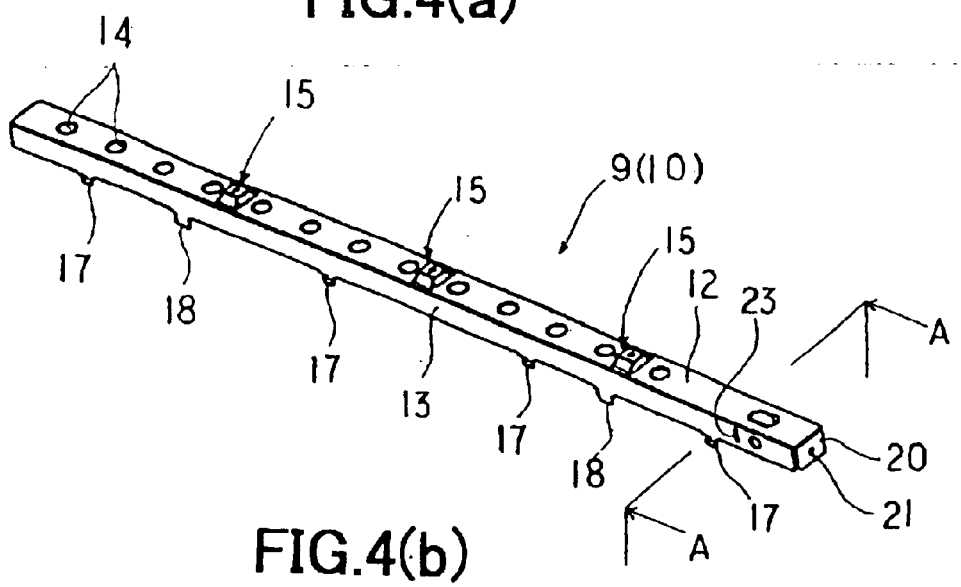

In the elongated top plate 12 extending in the longitudinal direction of the stay members 9 and 10, there are formed openings 14 allowing the shaft portions 7c2 of the volume elements 7c exposed above the top panel 2 to pass through, as shown in FIG. 4, whereby the electronic parts mounting area is not limited on the circuit board 6.

In the illustrated embodiment, the openings 14 are formed in correspondence to the volume elements 7c. Main bodies of the volume elements 7c are received in an inner side of the stay members 9 and 10, that is, within a groove space surrounded by the elongated top plate 12, the elongated parallel plates 13 provided in a standing manner on the circuit board and the circuit board 16, the shaft portions 7a2 of the volume elements 7c are passed through the openings 14, and the manual operating elements (knobs) 7b1 are later attached to the shaft portions 7b2. The openings 14 may be formed, for example, by long holes, whereby the openings 14 can correspond to a lot of equipment models.

Further, bridge-like raised portions 15 are formed at three positions by a uniform interval along the elongated top plate 12 of the stay members 9 and 10, and in the raised portions 15, a top is formed as a flat surface and forms a top contact portion 16. In the top contact portion 16, holes 16a allowing screws to pass through are formed. Since the stay members 9 and 10 are brought into contact with the top panel 2 via the raised portions 15, it is possible to securely bring the stay members 9 and 10 into contact with the top panel 2 even in the case that the top panel 2 generates a slight surface torsion or the like and has a low flatness, whereby it is possible to firmly connect the top panel of the exterior casing and the interior circuit board with each other.

Further, a plurality of protrusions are formed in a spaced manner in bottom ends of the pair of the elongated parallel plates 13 extending in the longitudinal direction of the stay members 9 and 10, as shown in FIG. 4, and these protrusions are constituted by approximately L-shaped protrusions 17 and flat-shaped protrusions 18. The approximately L-shaped protrusions 17 are inserted to holes 6a (refer to FIG. 3) formed in the circuit board 6 in correspondence to the L-shaped protrusions 17, and are bent by twisting a leading end, thereby structuring a bottom coupling portion for connecting the stay members 9 and 10 to the circuit board 6.

The flat-shaped protrusions 18 are fitted to guide holes 6b (refer to FIG. 3) formed in the circuit board 6 in correspondence to the flat-shaped protrusions 18, and construct guide protrusions for positioning the stay members 9 and 10 to the circuit board 6.

Figure 4B:
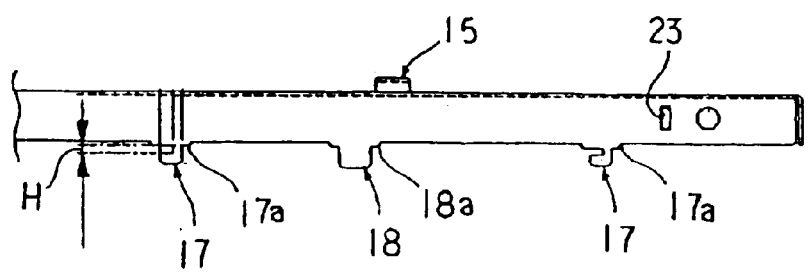
Figure 4C:
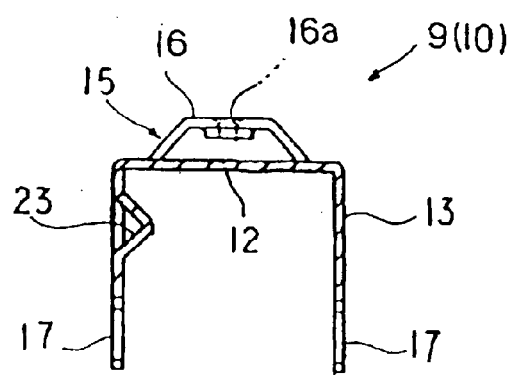

Step portions 17a and 18a capable of contacting the surface of the circuit board 6 are formed in root portions of the protrusions 17 and 18, as shown in FIG. 4(b). Accordingly, even in the case that the surface torsion exists on the circuit board and the flatness is deteriorated, the stay members 9 and 10 are brought into contact with the circuit board 6 by the step portions 17a and 18a. Accordingly, the stay members 9 and 10 are securely brought into contact with the circuit board 6, and it is possible to improve the flatness of the circuit board 6.

Further, the protrusion 17 is structured such as to clamp the circuit board 6 by the step portion 17a and an L-shaped portion, however, a clamping height H (refer to FIG. 4(b)) is approximately equal to a thickness of the circuit board 6, whereby it is possible to firmly connect the stay members 9 and 10 to the circuit board 6.

The protrusions 18 constituting the guide protrusions are preferably arranged between the protrusions 17 which constitute a bottom coupling portion and which are disposed by a predetermined interval. Accordingly, an accuracy of position of the circuit board 6 and the stay member is improved.

Figure 2:
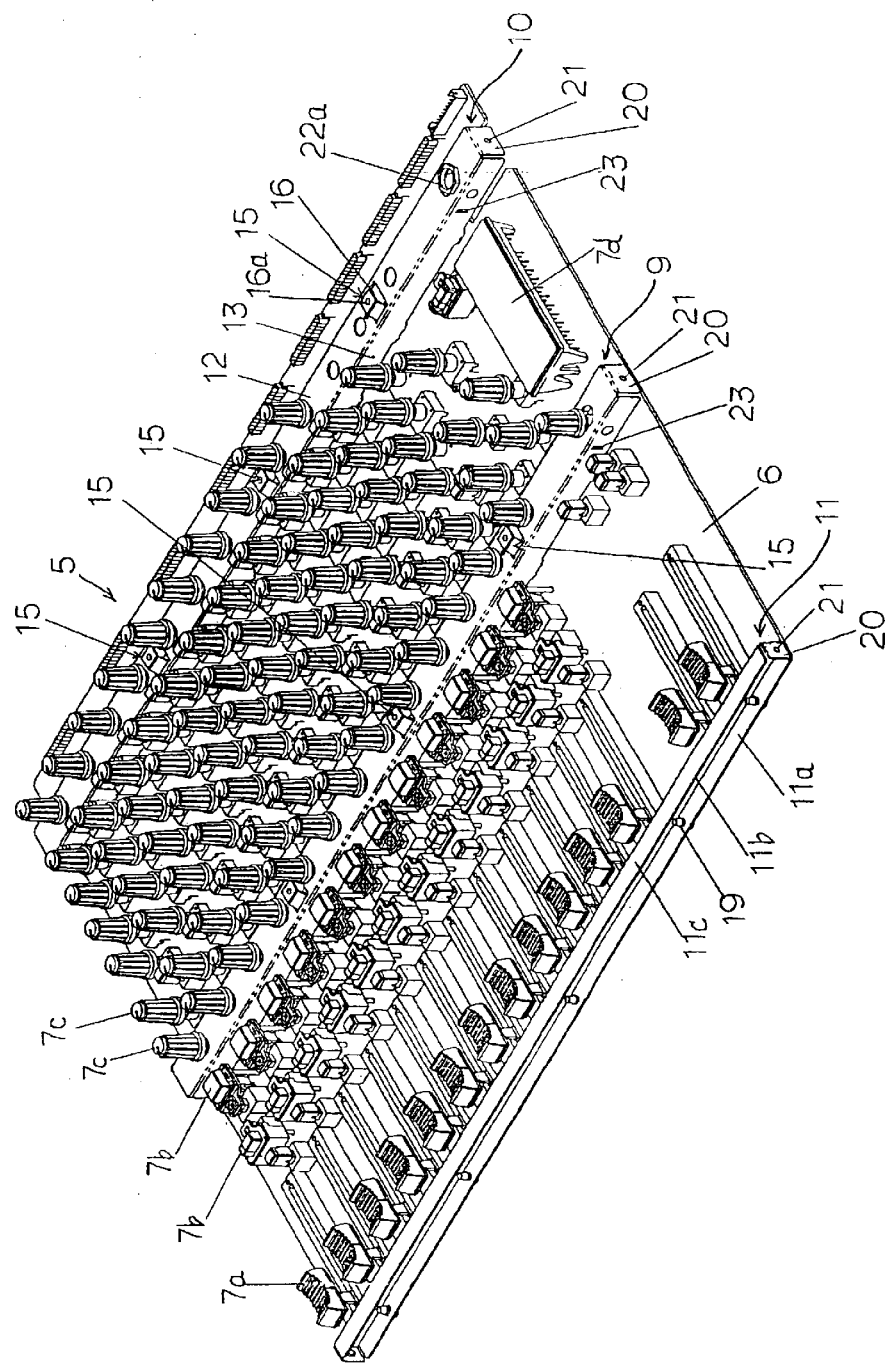
FIG. 2 is a perspective view showing the circuit board on which electronic parts are mounted, and a stay member corresponding to a constituting element in accordance with the present invention is connected to the circuit board.

The stay member 11 is a long body having an approximately C-shaped cross section and constituted by an elongated bottom plate 11a, an elongated side plate 11b and an elongated top plate 11c. A bottom coupling portion is structured by connecting the stay member 11 to the circuit board 6 via a screw inserting hole formed in the elongated bottom plate 11a by screws 19 (FIG. 2). The stay member 11 constitutes a top contact portion in which the elongated top plate 11c is brought into contact with the top panel 2.

Further, end coupling pieces 20 formed by bending both ends of the elongated top plates 12 and 11c are provided in opposite end portions of the stay members 9, 10 and 11, and threaded holes 21 are formed in the end coupling pieces 20 for the purpose of screw connecting to the side panel 4.

Figure 3:
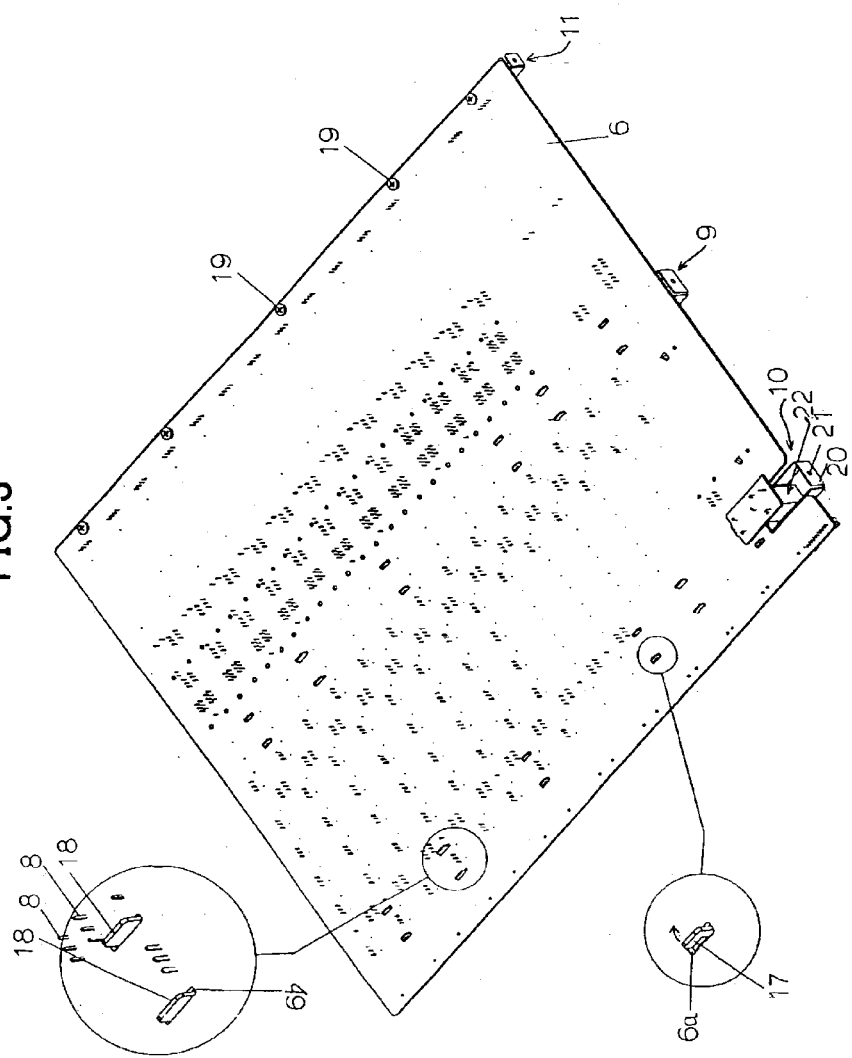
FIG. 3 is a perspective view showing a back surface of the circuit board in FIG. 2.

In this case, a horn jack 22 is received in the stay member 10 as shown in FIG. 3, and the horn jack 22 is fixed to the stay member 10 by a nut 22a as shown in FIG. 2. In this case, it is preferable to form a whirl-stop member for preventing the nut 22a from rotating at a time of fastening the nut 22a by forming a convex portion 23 (refer to FIG. 4(c)) protruding to an inner side in the elongated parallel plate 13. The same convex portion 23 is formed in the stay member 9 (refer to FIG. 2), and constitutes a whirl-stop member for the rotating operation type electronic parts such as the volume element or the like.

The electronic parts 7 are soldered in accordance with a known solder dip method. However, if the stay members 9, 10 and 11 are connected to the circuit board by the bottom coupling portion, it is possible to prevent the circuit board from warping due to a heat deformation at the solder dipping time. In particular, if both end sides of the stay members 9, 10 and 11 are supported by a side conveyor or the like of a dip soldering apparatus (not shown), it is possible to more securely prevent the circuit board from warping.

The electronic circuit assembly 5 to which the electronic parts 7 are soldered is screw fastened by aligning the threaded holes 21 of the end coupling pieces 20 with the openings 24 of the side panels 4 shown in FIG. 5.

Next, as shown in FIGS. 1 and 6, the top panel 2 is placed on the electronic circuit assembly 5, the top panel 2 is fixed to the side panels 4 by screwing, and some of the top contact portions 16 selected from the plurality of the top contact portions 16 formed in the stay members 9 and 10 (in the illustrated embodiment, the raised portion 15 arranged in the center among three raised portions 15 formed in each of the stay members 9 and 10) is screwed to the top panel 2. In the illustrated embodiment, the hole 16a formed in the top contact portion 16 is formed in accordance with a burring process (a rising process), and is structured such as to be screwed by a tapping screw. At the end, the assembling of the equipment is finished by screwing the bottom panel 3 to the side panels 4.

Further, in the illustrated embodiment, the side panel 4 is structured such that the threaded hole 4b is formed in a top panel mounting piece 4a formed by bending an end edge, and the side panel 4 is fixed to the top panel 2 by engaging the screw 25 (refer to FIG. 6) inserted to the opening (not shown) formed in the top panel 2 with the threaded hole 4b. In this case, in the illustrated embodiment, the top panel 2 is mounted on an upper surface of the top panel mounting piece 4a and fixed thereto, however, may be fixed to a lower surface of the top panel mounting piece 4a. Further, although an illustration is omitted, the structure may be made such that the threaded hole is formed in the side panel end surface and the top panel 2 is mounted on the end surface and screwed, in the case that the side panel 4 is thick.

In the case that the circuit board is fixed to the casing 1 in the manner mentioned above, the stay members 9, 10 and 11 connected to the circuit board 6 function as the spacer while preventing the electronic circuit assembly 5 from warping. Accordingly, the connection between the top panel 2 and the electronic circuit assembly 5 can be achieved by a small number of screws (two in the illustrated embodiment). In the case that the end coupling pieces 20 of the stay members 9, 10 and 11 are screw fastened to the side panels 4, it is possible to omit the screwing with the top panel 2, and a mounting work efficiency is widely improved.

Further, since the stay members 9, 10 and 11 also function as a beam for reinforcement, it is possible to satisfy a high flatness which is required in the case that the circuit board has a large size and has a lot of operating elements mounted thereon, as in the case of the acoustic mixing machine of the present embodiment. Further, even in the case that a lot of manual operating electronic parts such as the faders or the like are mounted and a pressing force is frequently applied, it is possible to stand against the operating pressing force and it is possible to reinforce and protect not only the circuit board but also the top panel.

In this case, the casing is typically made of a metal in order to apply a high class feeling. In conventional, the tubular boss described in the prior art mentioned above is made of the metal in the same manner as the casing and is welded to the back surface of the top panel. However, since the front surface of the top panel in correspondence to the welded portion is oxidized due to the welding, and the surface condition becomes inhomogeneous by grinding and removing the oxide film, it is necessary to paint the casing by using a dark color coating compound in which a paint spot is unremarkable. In accordance with the present invention, since it is not necessary to weld the conventional tubular boss mentioned above to the top panel 2, there is no fear of the paint spot and it is possible to obtain an effect that a painting color is not limited.

What is claimed is:

1. An electronic equipment comprising:
   a casing that encloses a spacing and that has a top panel covering the spacing;
   a circuit board that has a pair of end portions and a major surface extending between the pair of the end portions for mounting a plurality of electronic parts on the major surface, the circuit board being disposed in the spacing of the casing in opposed relation to the top panel; and
   a plurality of stay members each having an elongated shape extending between the pair of the end portions of the circuit board for reinforcing the major surface of the circuit board, the stay member having a bottom coupling portion disposed in contact with the major surface of the circuit board for coupling with the circuit board, and a top contact portion disposed in contact with a back surface of the top panel for engagement with the casing,
   wherein some of the plurality of electronic parts include a shaft portion disposed between the stay members on the circuit board, and
   wherein the top panel of the casing includes insertion holes for inserting the shaft portion of the electronic parts such that the manual operating elements are attached to the shaft portions above the top panel.

2. The electronic equipment according to claim 1, wherein the casing has a pair of side panels disposed along opposite ends of the top panel for accommodating the circuit board between the pair of the side panels, and the stay member has a pair of end coupling portions at opposite ends of the elongated shape for coupling with the side panels.

3. The electronic equipment according to claim 2, wherein the side panel has a top panel mounting piece formed by bending an edge of the side panel, and the top panel mounting piece is formed with a threaded hole, while the top panel has an opening in correspondence with the threaded hole of the top panel mounting piece of the side panel, such that the side panel is fixed to the top panel by engaging a screw inserted into the opening of the top panel with the threaded hole.

4. The electronic equipment according to claim 1, wherein the circuit board is formed with a guide hole for positioning of the stay member, and the bottom coupling portion of the stay member includes a guide protrusion for engagement with the guide hole.

5. The electronic equipment according to claim 4, wherein the bottom coupling portion of the stay member includes a plurality of guide protrusions, at least one of which has a hook at the end of the guide protrusion, the hook being inserted into the guide hole of the circuit board and being bent so as to fix the stay member to the circuit board.

6. The electronic equipment according to claim 4, wherein the guide protrusion has a step portion at a root portion of the guide protrusion, the step being brought into contact with the major surface of the circuit board when the guide protrusion is engaged with the guide hole.

7. The electronic equipment according to claim 1, wherein the stay member has an elongated top plate extending between the pair of the end portions of the circuit board in opposed relation to the top panel, and a pair of elongated parallel plates folded downward from the elongated top plate such that the elongated top plate and the pair of the elongated parallel plates define a groove having a rectangular cross section for accommodating therein an electronic part.

8. The electronic equipment according to claim 7, wherein the elongated top plate of the stay member has an opening for allowing an electronic part accommodated in the groove to penetrate through the opening into the top panel of the casing.

9. The electronic equipment according to claim 7, wherein the top contact portion of the stay member is formed of a series of raised portions arranged along the elongated top plate of the stay member.

10. The electronic equipment according to claim 7, wherein the elongated parallel plate is formed with a convex portion penetrating into the groove of the stay member so as to restrict an unnecessary rotation of the electronic part accommodated in the groove of the stay member.

11. The electronic equipment according to claim 1, wherein the plurality of the stay members are arranged in parallel to each other and coupled to the major surface of the circuit board for reinforcing the circuit board, one of the stay members having a different shape than other stay members such that said one stay member has an elongated top plate placed in opposed relation to the top panel, an elongated bottom plate placed in contact with the circuit board, and an elongated side plate connecting between the elongated top plate and the elongated bottom plate, the elongated top plate and the elongated bottom plate has a width smaller that a height of the elongated side wall.

12. The electronic equipment according to claim 1, wherein the casing comprises a plurality of panels connected to each other, and the circuit board mounting the electronic parts is engaged with one of the panels and the manual operating elements attached to the electronic parts are disposed on the same panel as said one panel.

13. The electronic equipment according to claim 12, wherein said one panel comprises the top panel.

* * * * *